United States Patent [19]
Kim et al.

[11] Patent Number: 5,148,251
[45] Date of Patent: Sep. 15, 1992

[54] PHOTOCONDUCTIVE AVALANCHE GAAS SWITCH

[75] Inventors: Anderson H. Kim, Toms River; Maurice Weiner, Ocean, both of N.J.; Louis J. Jasper, Jr., Fulton, Md.; Robert J. Youmans, Brick, N.J.

[73] Assignee: The United States of America as represented by the Secretary of the Army, Washington, D.C.

[21] Appl. No.: 797,592

[22] Filed: Nov. 25, 1991

[51] Int. Cl.$^5$ ............................................. H01L 27/14
[52] U.S. Cl. ...................................... 357/30; 357/19; 357/16; 357/58; 357/13; 250/211 J; 359/243
[58] Field of Search ................. 357/30 A, 30 R, 30 P, 357/30 E, 30 H, 19, 58, 16, 30 R, 13; 250/211 J, 211 R; 359/243

[56] References Cited

U.S. PATENT DOCUMENTS

| | | | |
|---|---|---|---|
| 4,633,286 | 12/1986 | Bovino | 357/30 Q |
| 4,984,032 | 1/1991 | Miura et al. | 357/30 A |
| 5,028,971 | 7/1991 | Kim et al. | 357/30 |

FOREIGN PATENT DOCUMENTS

| | | | |
|---|---|---|---|
| 56-80179 | 7/1981 | Japan | 357/30 A |
| 2-294078 | 12/1990 | Japan | 357/30 P |
| 3-16273 | 1/1991 | Japan | 357/30 P |

OTHER PUBLICATIONS

Kuchta et al., "Improved Contacts to Semi-Insulating GaAs Photoconductive Switches Using a Graded Layer of InGaAs", *Appl. Phys. Lett.*, 57 (15), Oct. 8, 1990, pp. 1534–1536.

*Primary Examiner*—William Mintel
*Attorney, Agent, or Firm*—Michael Zelenka; William H. Anderson

[57] ABSTRACT

An optically activated avalanche GaAs switch having two opposing optical windows for receiving optical energy from an illumination source which may be, for example, a laser diode operating at a 1.06 micron wavelength. The switch is a semiconductor PIN structure including a substrate of intrinsic GaAs material within which is formed opposing highly doped deep recessed p+ and n+GaAs layers underlying a pair of ohmic contacts including outer annular layers of metallization which surround respective centrally located optical windows formed of AlGaAs. By illuminating the switch from opposite sides through the optical windows, electron-hole pairs are generated and a condition for an avalanche mode of operation is created in the center region of the device rendering it conductive.

9 Claims, 2 Drawing Sheets

PHOTOCONDUCTIVE AVALANCHE GAAS SWITCH

GOVERNMENT INTEREST

The invention described herein may be manufactured, used, and licensed by or for the Government for governmental purposes without the payment to me or us of any royalty thereon or therefor.

CROSS REFERENCE TO RELATED APPLICATION

This application is related to U.S. Ser. No. 07/797,595 entitled "Optically Activated Sub-Nanosecond Hybrid Pulser, which was filed in the name of Anderson H. Kim et al on Nov. 25, 1991, and which is assigned to the assignee of the present invention.

BACKGROUND OF THE INVENTION

1. Field of the Invention

The present invention relates generally to photoconductive switches and more particularly to photoconductive bulk gallium arsenide switches for use in impulse radars, active counter measure apparatus and high power microwave generation devices.

2. Description of the Prior Art

It is generally known that a relatively high dark resistivity semiconductor can be transformed from a semi-insulating state to a quasi-metallic state almost instantaneously when it is illuminated with optical pulses of a proper wavelength. Due to this property, high resistivity semiconductors have been widely used as photoconductive optically activated switches because they are able to provide fast risetime, low jitter, and high power capabilities. These qualities have proved most advantageous in devices that produce high intensity microwaves.

A typical prior art photoconductive switch of this type is shown and described, for example, in U.S. Pat. No. 5,028,971, entitled, "High Power Photoconductor Bulk GaAs Switch", which issued to A.H. Kim et al on Jul. 2, 1991. The teachings of this patent are meant to be specifically incorporated herein by reference and comprise a bulk piece of gallium arsenide which is masked with a grided electrode on either one or both sides of the semiconductor body. The grided electrodes are electrically connected to a power supply source and an electric field is distributed substantially uniformly over the entire active switching area. The pattern of electrodes is designed to permit as much light penetration as possible through the active area of the semiconductor. When laser light is introduced to the switch parallel to the applied electric field and having an effective gap in the order of 5 mm-7 mm, the semiconductor changes from an off state to an on state in less than a nanosecond. The optical illumination for activating the switch typically comprises pulses of a Q switched neodymium doped yttrium aluminum garnet (Yd:YAG) laser generating an output of 0.8 mj at a wavelength of 1.06 microns.

In the above-referenced related application which is also meant to be incorporated herein by reference, there is disclosed an optically activated sub-nanosecond hybrid pulser using radial and quasi-radial transmission lines and which incorporate a photoconductive GaAs switch device as described above. Depending on the pulsewidth requirement and the structure of the radial transmission line, a voltage gain can be obtained without degradation of the pulse risetime. Where a solid state laser diode is used as the optical light source, its relatively low optical output energy and short wavelength output requires an extremely efficient optically activated switch.

SUMMARY

It is an object of the present invention, therefore, to provide an improvement in fast risetime, high voltage optically activated switches.

It is another object of the invention to provide an improvement in optically activated bulk gallium arsenide switches.

It is a further object of the invention to provide a photoconductive avalanche gallium arsenide switch for use in a sub-nonosecond pulse generator and which exhibits high quantum efficiency and long durability.

These and other objects of the invention are achieved by an optically activated avalanche GaAs switch having two opposing optical windows for receiving optical energy from an illumination source which may be, for example, a laser diode operating at a 1.06 micron wavelength. The switch comprises a semiconductor PIN structure including a substrate of intrinsic GaAs material within which is formed opposing highly doped deep recessed p+ and n+ GaAs layers underlying a pair of ohmic contacts including outer annular layers of metallization which surround respective centrally located optical windows formed of AlGaAs. By illuminating the switch from two opposite sides through the optical windows, electron-hole pairs are generated and a condition for an avalanche mode of operation is created in the center region of the device rendering it conductive.

BRIEF DESCRIPTION OF THE DRAWINGS

The following detailed description of the invention will be more readily understood when considered in conjunction with the accompanying drawings in which.

DETAILED DESCRIPTION OF THE INVENTION

Figure 1:
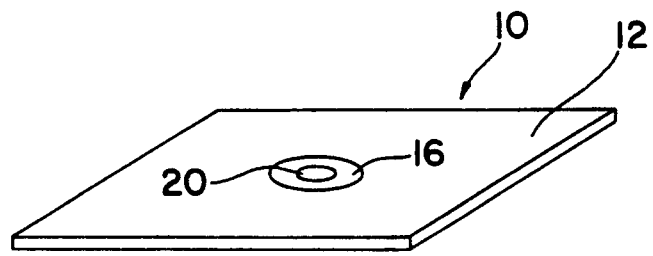
FIG. 1 is a perspective view generally illustrative of the preferred embodiment of the invention.
Figure 2:
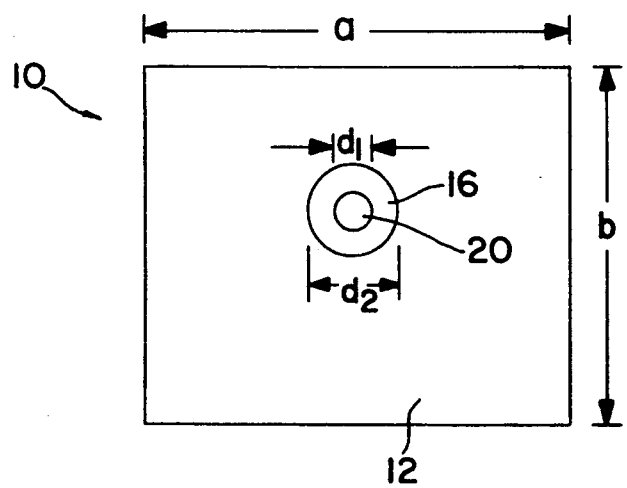
FIG. 2 is a top planar view illustrative of the embodiment shown in FIG. 1.
Figure 3:
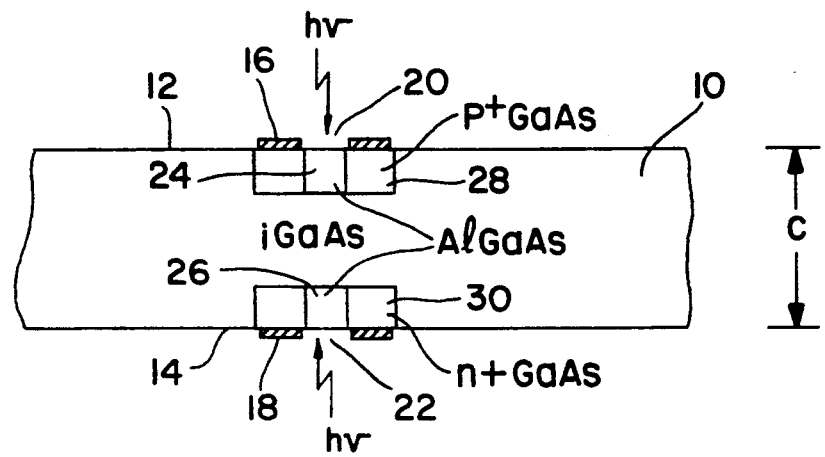
FIG. 3 is a partial central transverse cross-sectional view of the embodiment shown in FIGS. 1 and 2.

Referring now collectively to the drawings, shown thereat is an optically activated gallium arsenide (GaAs) switch device which is designed for the avalanche mode of operation and comprises, among other things, a substrate 10 (FIG. 1) of intrinsic type GaAs material which has a thickness (c) as shown in FIG. 3 which provides a 2.0 mm. gap distance between top and bottom surfaces 12 and 14. For a substrate 10 having equal length and width dimensions (a) and (b) of 1.8 cm., respectively, metallization layers 16 and 18 in the form of generally circular annular rings having an inside diameter $d_1$ and an outside diameter of $d_2$ (FIG. 2) having dimension of 1.0 mm. and 6.0 mm. are fabricated on the top and bottom surfaces 12 and 14. The hole or circular openings 20 and 22 in the metallizations 16 and 18 define activating light apertures for two opposing optical windows 24 and 26 centrally located within highly doped deep recessed GaAs layers 28 and 30 located under the annular layers of metallization 16 and 18. The windows 24 and 26 are comprised of AlGaAs regions formed in the intrinsic GaAs substrate 10. Since typical metallization techniques developed for n-type and p-type GaAs substrates are not compatible with AlGaAs, the recess region surrounding the AlGaAs optical windows 24 and 26 are comprised of heavily doped p+ and n+ GaAs annular regions beneath the annular metallization layers 16 and 18.

Wavelengths of activating light produced from laser devices such as solid state laser diodes comprised of Nd:YAG and used to trigger the switch are very close to the bandgap energy of GaAs. By fabricating the optical windows 24 and 26 of AlGaAs, the bandgap energy of the two windows become larger than the instant optical light source and therefore most of the optical energy applied through the circular apertures 20 and 22 in the metallization layers 16 and 18 will reach the intrinsic GaAs material of the substrate 10 where electron-holes pairs are created.

Figure 4:
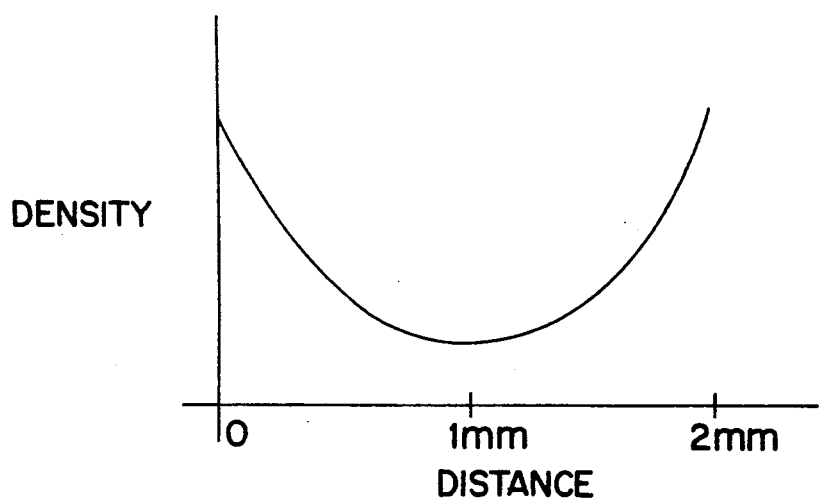
FIG. 4 is a characteristic curve resulting from a two-sided illumination of the preferred embodiment of the invention, particularly as shown in FIG. 3.

By illuminating the switch as shown in FIG. 3 from opposite sides, the photon generated carrier density will create a non-uniform distribution, typically as shown in FIG. 4, where the lowest carrier density is at the center of the substrate 10 which provides a condition for the avalanche mode of operation (electric field >100 kV/cm.). In addition, a unique feature of the switch geometry shown is a low electric field strength at the interface between the p+ GaAs and n+ GaAs regions 28 and 30 and the metallization layers 16 and 18. Thus the PIN structure under the metallization enhances the voltage hold-off capability which operates to prevent destructive breakdown when a high voltage is applied across the metallization layers.

In a linear mode of operation, the amount of electron-hole pairs generated by instant laser light is proportional to the input laser energy. Hence, relatively large amounts of laser energy is necessary to trigger large gap distance switch devices, which are necessary to hold off large voltages. With an optically triggered avalanche GaAs switch comprising the subject invention, much more conduction carriers will be produced than the number of optically generated electron-hole pairs. Therefore, an optically triggered avalanche GaAs switch in accordance with the subject invention will require less laser energy to trigger the switch.

A bulk switch made with semi-insulating GaAs material such as shown in FIG. 3, for example, has a negligible dark current under high bias voltage. By illuminating this switch with the proper wavelength of optical light, e.g. 1.06 microns generated by an Nd:YAG laser, the semiconductor substrate 10 can change from a non-conducting off-state to a conducting on-state in less than a nanosecond. The main purpose of the highly doped p+ and n+ layers 28 and 30 is to make a stable ohmic contact. Because a large portion of the incoming laser energy is consumed at the shallow region in the vicinity of the highly doped p+ and n+ layers 28 and 30, only a small portion of the laser energy will be utilized to generate electron-hole pairs in the bulk semi-insulating GaAs material, and therefore most of the incoming optical energy passing through the optical window regions 24 and 26 will be utilized in the generation of conducting current.

As noted, the highly doped deep recessed layers 28 and 30 of p+ GaAs and n+ GaAs, respectively, will remove the high from the edge of the contact metallization layers 16 and 18. In addition, a reserve bias voltage applied across the switch will further remove the field from the highly doped layers 28 and 30 to the bulk GaAs material of the substrate 10. Therefore, the low field at the contact area and the high carrier injection efficiency will substantially improve the switch performance and durability, particularly when used in connection with an optically activated sub-nanosecond pulser, the type shown and described in the related application Ser. No. 07/797,595.

Having thus shown and described what is at present considered to be the preferred embodiment of the invention, it should be noted that the same has been made by way of illustration and not limitation. Accordingly, all modifications, alterations and changes coming within the spirit and scope of the invention as set fort in the appended claims are meant to be included.

What is claimed is:

1. A photoconductive switch device, comprising:
   a substrate of semiconductor material of relatively high resistivity and which is responsive to optical energy of a predetermined wavelength to switch from a semi-insulating state to a quasi-metallic state, said substrate being of a predetermined thickness for supporting an avalanche mode of operation;
   a pair of semiconductor optical window regions formed in said substrate adjacent two opposing outer surfaces thereof;
   respective doped semiconductor regions in said substrate adjacent said outer surfaces surrounding said window regions; and
   a pair of metallization patterns formed on said outer surfaces over said highly doped regions and having at least one aperture therein to said optical window regions for coupling optical energy into said substrate through said window regions thereby providing a double sided illumination device which will create the lowest carrier density at the center of the substrate to generate a condition for the avalanche mode of operation.

2. The switch device according to claim 1 wherein said substrate is comprised of gallium arsenide.

3. The switch device according to claim 2 wherein said window regions are comprised of aluminum gallium arsenide.

4. The switch device according to claim 3 wherein said substrate is further comprised of intrinsic type gallium arsenide.

5. The switch device according to claim 4 wherein said highly doped regions are respectively comprised of p+ and n+ type gallium arsenide for providing a PIN photoconductive switch structure.

6. The switch device according to claim 1 wherein said patterns of metallization comprise annular patterns of metallization.

7. The switch device according to claim 6 wherein said highly doped recessed regions are comprised of annular regions underlying said annular patterns of metallization.

8. The switch device according to claim 7 wherein said apertures are said patterns of metallization comprised generally of centralized circular holes through said outer surfaces of said substrate adjacent said optical window regions.

9. The switch device according to claim 8 wherein said optical window regions are generally circular in plan view.

* * * * *